United States Patent [19]

Takahashi et al.

[11] Patent Number: 5,207,102
[45] Date of Patent: May 4, 1993

[54] SEMICONDUCTOR PRESSURE SENSOR

[75] Inventors: Yoshiharu Takahashi; Tetsuya Hirose; Hideyuki Ichiyama, all of Itami, Japan

[73] Assignee: Mitsubishi Denki Kabushiki Kaisha, Toyko, Japan

[21] Appl. No.: 763,217

[22] Filed: Sep. 20, 1991

[30] Foreign Application Priority Data

Feb. 12, 1991 [JP] Japan .................. 3-038902

[51] Int. Cl.⁵ .................. G01L 7/08; G01L 9/06
[52] U.S. Cl. .................. 73/727; 29/671.1; 73/706; 73/721; 128/675; 338/4
[58] Field of Search .................. 73/727, 726, 721, 720, 73/718, 724, 756, 754, DIG. 4, 706; 338/4, 42; 128/673, 675; 29/621.1

[56] References Cited

U.S. PATENT DOCUMENTS

| | | | |
|---|---|---|---|
| 4,655,088 | 4/1987 | Adams | 73/756 |
| 4,658,651 | 4/1987 | Le | 73/727 |
| 4,691,575 | 9/1987 | Sonderegger et al. | 73/721 |
| 4,838,089 | 6/1989 | Okada et al. | 73/727 |

Primary Examiner—Donald O. Woodiel
Attorney, Agent, or Firm—Leydig, Voit & Mayer

[57] ABSTRACT

A semiconductor pressure sensor is manufactured by integrally encapsulating a semiconductor pressure, sensor chip, a pedestal, leads, wires and a die pad in an outer package except for the surface of a diaphragm of the semiconductor pressure sensor chip and the reverse side of the die pad. The ratio of the thickness of the pedestal to the thickness of the semiconductor pressure sensor chip is 7.5 or less, while the ratio of the diameter of an opening formed in the outer package at the surface of the diaphragm and the diameter of the diaphragm is 1 or more. The thermal stress generated in the semiconductor pressure sensor chip can freely be reduced to a desired value, and a semiconductor pressure sensor exhibiting a desired accuracy can therefore be obtained. Furthermore, since the semiconductor pressure sensor can be manufactured by an ordinary IC manufacturing process, a semiconductor pressure sensor with reduced cost and having high quality can be produced.

5 Claims, 9 Drawing Sheets

SEMICONDUCTOR PRESSURE SENSOR

BACKGROUND OF THE INVENTION

1. Field of the Invention

This invention relates to a semiconductor pressure sensor (to be abbreviated to a "pressure sensor" hereinafter), and, more particularly, to a pressure sensor for precisely measuring pressure by reducing residual stress resulting from the manufacture of the pressure sensor.

2. Description of the Related Art

FIG. 12 is a cross sectional view which illustrates a conventional pressure sensor disclosed in, for example, U.S. Pat. No. 4,655,088. FIGS. 13 and 14, respectively, cross sectional and plan views which illustrate the outer package of the pressure sensor shown in FIG. 12. Referring to the drawings, a pressure sensor chip is secured, by a die bonding material 6, to an outer package 10 called an "integrated mold" made of, for example, epoxy resin. The outer package 10 has an opening 13 formed therein and leads 8 provided therein. The pressure sensor chip 1 and the lead 8 are connected to each other by wires 9, and the upper portion of the pressure sensor chip 1 is covered with a protecting resin 14. A dust-protecting disc 12 having an opening 11 formed therein is disposed in the upper portion of the pressure sensor chip 1.

The conventional pressure sensor arranged as described above is manufactured in such a manner that it is integrally molded together with the leads 8 to form the outer package 10. Subsequently, the pressure sensor chip 1 is die bonded by the die bonding material 6, and the pressure sensor chip 1 and the leads 8 are wire bonded to the wires 9. Then, the protecting resin 14 is applied to the surface of the pressure sensor chip 1, and a disc 11 is adhered to the outer package 10 so that the pressure sensor is manufactured. As described above, the pressure sensor chip 1 is, by the die bonding material 6, adhered to the outer package 10 which has been molded integrally with the leads 8. Therefore, the wires 9 and the pressure sensor chip 1 are not integrally molded with the outer package 10, but only the leads 8 and the outer package 10 are integrally molded.

In order to improve the characteristics of the thus constituted pressure sensor by reducing the residual stress, it is most effective to arrange the component to be made of a material having a linear expansion coefficient which approximates the linear expansion coefficient of silicon, the material for the pressure sensor chip 1. That is, the accuracy of the pressure sensor is determined by the physical properties of the material employed. The reason for this lies in that the residual stress generated during manufacturing acts on the resistor of the pressure sensor, causing the accuracy in the measurement of the pressure to be reduced.

Hitherto, the offset drift linearity (the temperature change linearity of the offset voltage) and the span drift linearity (the output voltage linearity when pressure is applied) have been substantially determined by the structure and the material of the pressure sensor. Therefore, the material and the structure must be changed in order to obtain satisfactory characteristics. For example, the pressure sensor shown in FIG. 12 suffers from poor characteristics, and the obtainable accuracy therefore limits the fields in which it can be used. The reason for this lies in that the residual stress generated after the components have been assembled is too large because the difference between the linear expansion coefficient, $3.5 \times 10^{-6}$ (1/°C.) of silicon which forms the pressure sensor chip 1 and the linear expansion coefficient, $33 \times 10^{-6}$ (1/°C.), of, the epoxy resin forming the outer package 10 is too large since the outer package 10 is directly die bonded to the pressure sensor 1.

Accordingly, in order to produce an accurate pressure sensor, a silicon pedestal made of the same material as the material for the silicon chip or, of example, a pyrex glass pedestal having substantially the same linear expansion coefficient as that of the silicon chip is integrally molded with the silicon chip, the thus molded pedestal being die bonded to the lead frame or the stem so that the residual stress is reduced. At this time, the more the thickness of the pedestal, the greater significant is the reduction in the residual stress. However, if the pedestal has the large thickness, the temperature at the wire bonding pad portion of the pressure sensor chip cannot easily be raised at the time of wire bonding. As a result, the temperature of a heater for heating the wire bonding pad portion must be raised. However, the temperature cannot be raised to a temperature higher than the durable temperature of the molding resin. Accordingly, the wire bonding must be performed by the application of ultrasonic oscillations and force. However, if the level of the ultrasonic oscillations is raised, another problem arises in that the plating must have a large thickness on the leads.

SUMMARY OF THE INVENTION

Accordingly, an object of the present invention is to provide a pressure sensor revealing a satisfactory accuracy realized by reducing stress and strain (the stress and the strain linearly change within an elastic limit) in a pressure sensor due to the difference between the linear expansion coefficients of different materials at the time of assembling its components by properly designing the dimension (thickness) of a pedestal and the shape of an outer package.

In order to achieve the above-described object, according to one aspect of the present invention, there is provided a semiconductor pressure sensor comprising: a semiconductor pressure sensor chip including a resistor and a diaphragm; a pedestal on which the semiconductor pressure sensor chip is placed; a die pad on which the pedestal is mounted; leads; wires electrically connecting the respective leads to the semiconductor pressure sensor chip; and an outer package integrally sealing the semiconductor pressure sensor chip, the pedestal, the leads, the wires and the die pad except for the surface of the diaphragm of the semiconductor pressure sensor chip and the reverse side of the die pad.

DESCRIPTION OF THE PREFERRED EMBODIMENTS

Figure 1:
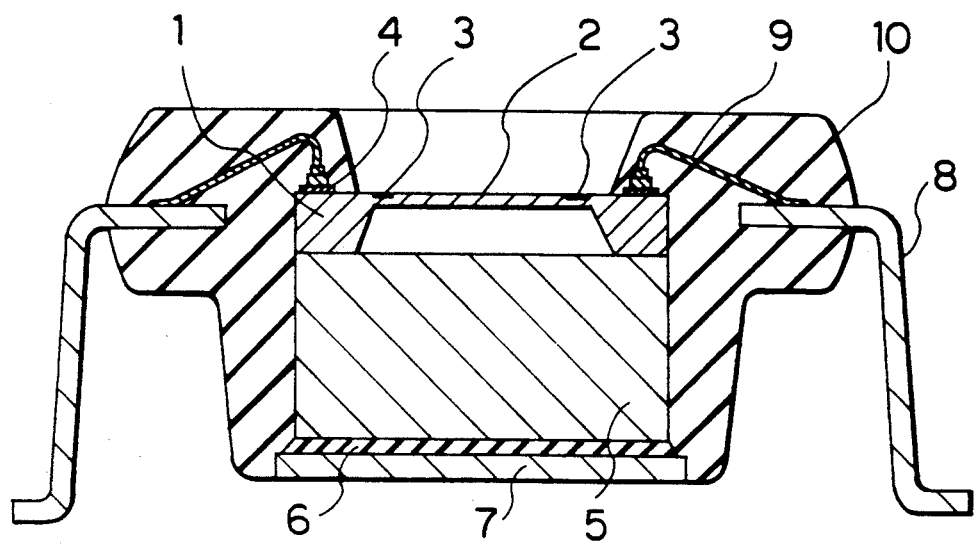
FIG. 1 is a cross sectional view which illustrates an embodiment of a pressure sensor according to the present invention.
Figure 2:
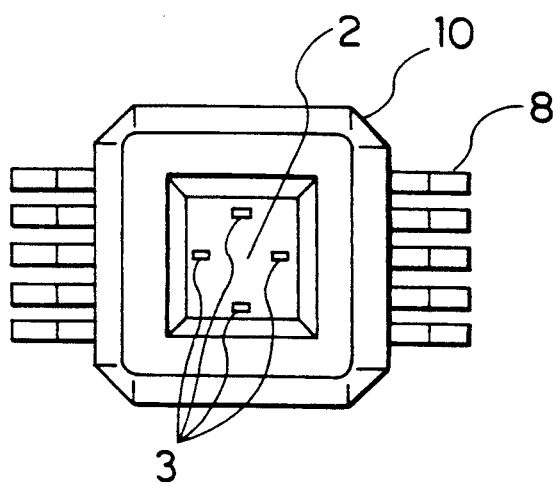
FIG. 2 is a plan view which illustrates the pressure sensor shown in FIG. 1.

FIG. 1 is a cross sectional view which illustrates an embodiment of a pressure sensor according to the present invention. FIG. 2 is a plan view of the same. Referring to the drawings, reference numerals 1, 6 and 8 to 10 represent the same elements of the above-described conventional pressure sensor. The pressure sensor 1 has a diaphragm 2 formed by etching, the diaphragm 2 having a piezoelectric resistor 3 formed thereon. The pressure sensor chip 1 is placed on a pedestal 5, the pedestal 5 being secured to the surface of a die pad 7 by the die bonding material 6, for example, silicone rubber. The lead frame including the die pad 7 is made of, for example, 42-alloy, and inner and outer leads of the lead frame are previously plated.

A wire bonding pad 4 and the leads 8 respectively formed on the pressure sensor chip 1 are connected to each other by the wires 9.

The above-described pressure sensor chip 1, the pedestal 5, the wires 9 and the die pad 7 are integrally encapsulated by the outer package 10, for example, epoxy resin except for the top surface of the diaphragm 2 and the reverse side of the die pad 7. The integral encapsulation by the outer package 10 can be completed by an ordinary process for manufacturing ICs. That is, hitherto, the integral molding process could not be combined with a general assembly line for ICs because the stress generated in the pressure sensor chip 1 due to heat distortion could not be absorbed. However, the components for the pressure sensor according to the present invention can be assembled by using conventional equipment and assembly lines.

Figure 3:
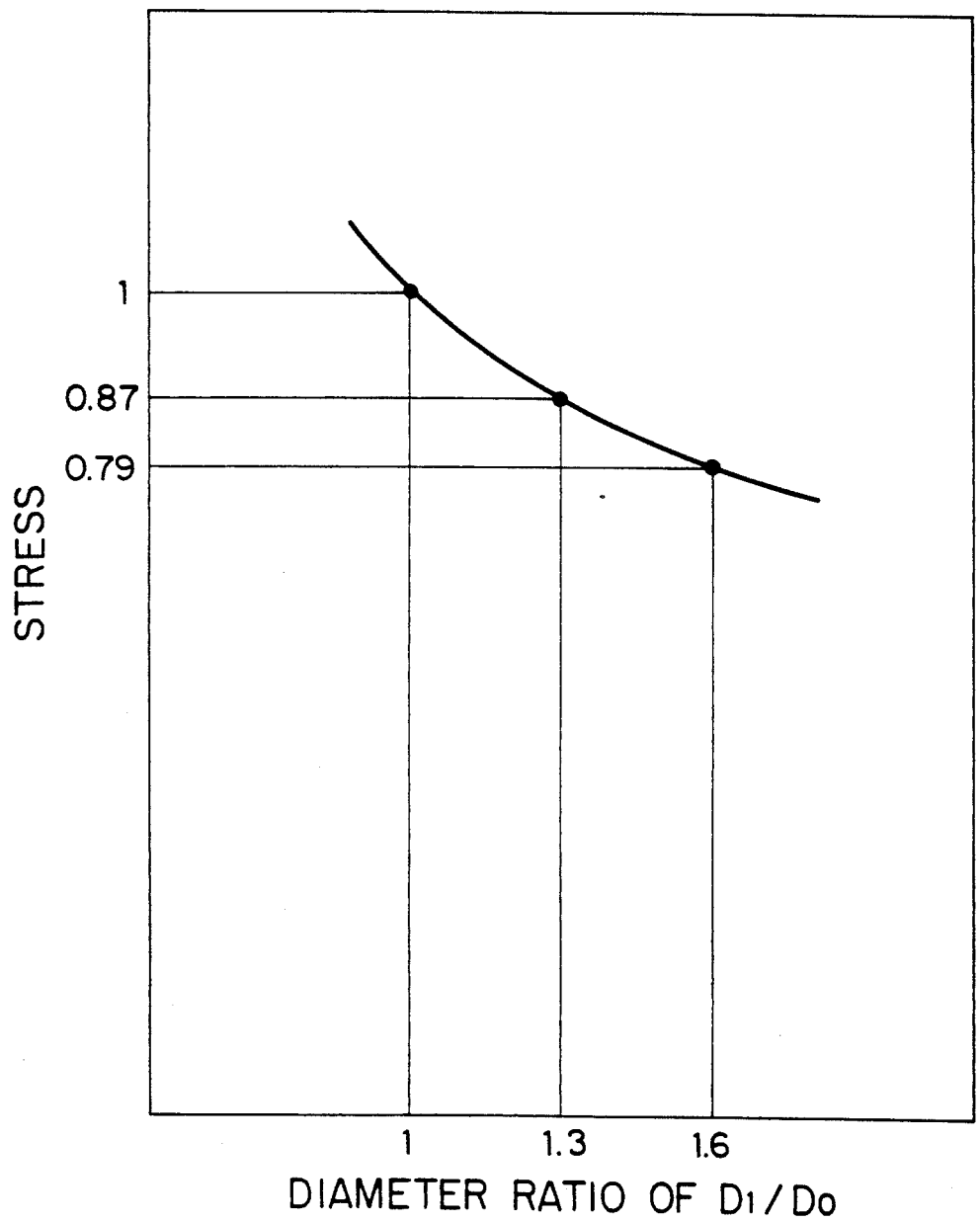
FIG. 3 is a graph which illustrates the relationship between the ratio of the diameter of an opening formed in an outer package and the diameter of the diaphragm and the stress of the diaphragm.
Figure 4:
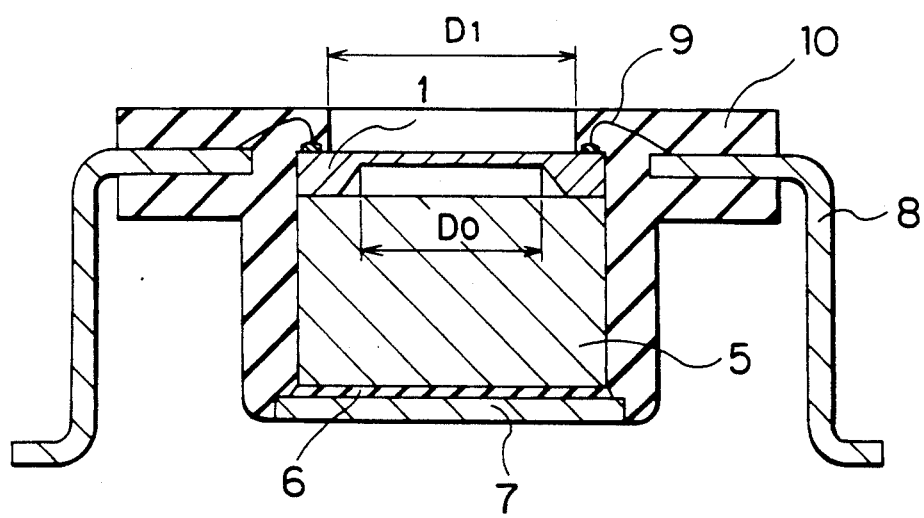
FIG. 4 is a cross section view of the pressure sensor which illustrates the diameter of the diaphragm and the diameter of the opening formed in the outer package shown in FIG. 3.

Then, referring to FIGS. 3 and 4, how the stress generated in the piezoelectric resistor disposed in the diaphragm is changed in the thus constituted pressure sensor in accordance with the ratio of diameter D1 of an opening formed in the molded outer package 10 and the dimension (diameter) D0 of the diaphragm 2 will be described. FIG. 3 is a graph which illustrates the magnitude of the stress with respect to the ratio D1/D0 The stress is 1 (100%) when the diameter D1 of the opening is the same as the dimension D0 of the diaphragm. As can be seen from the graph, when the ratio D1/D0 is made to be 1.6, the stress is reduced by 20%. As described above, according to the present invention, the stress generated in the portion of the pressure sensor chip 1 in which the piezoelectric resistor 3 is disposed can be reduced by making the ratio D1/D0 1 or more.

Figure 5:
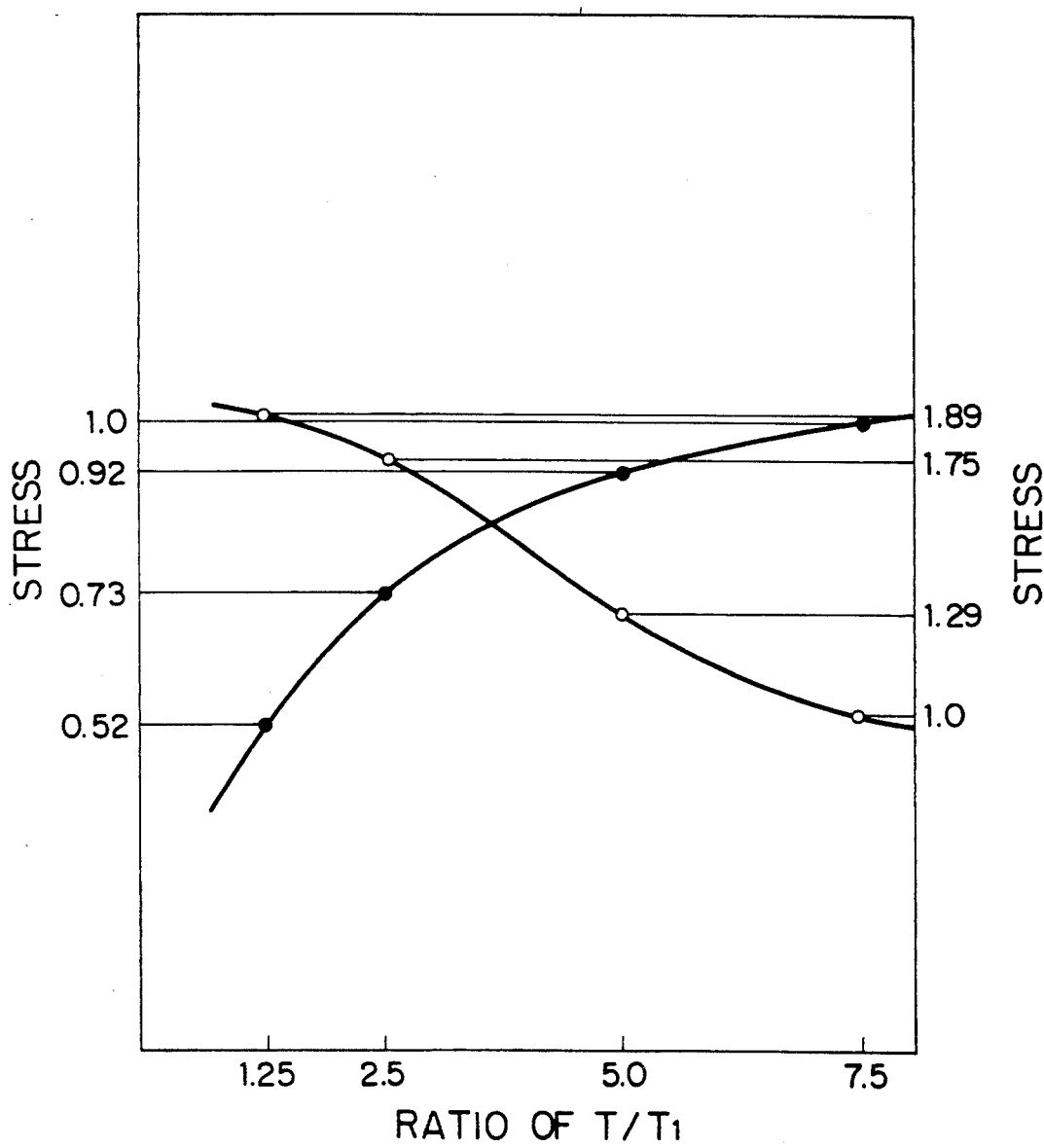
FIG. 5 is a graph which illustrates the relationship between the ratio of the thickness of a pedestal and the thickness of the pressure sensor and the stress of the diaphragm.
Figure 6:
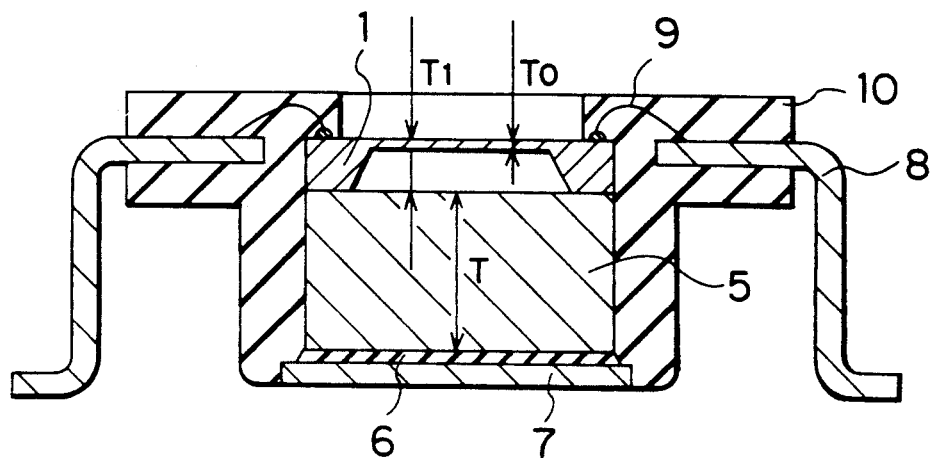
FIG. 6 is a cross sectional view of the pressure sensor which illustrates the thickness of the pressure sensor and that of the pedestal shown n FIG. 5.

FIGS. 5 and 6 respectively illustrate the effect obtainable when the reverse side of the die pad 7 is not sealed by the outer package 10 and the relationship between the ratio of thickness T of the pedestal 5 and thickness T1 of the pressure sensor chip 1 and the stress generated where the piezoelectric resistor 3 is disposed. Referring to FIG. 5, an assumption is made that the stress generated when $T/T1 = 7.5$ is 1 (100%), and black dots show the magnitude of the main stress that occurs in the piezoelectric resistor 3 on the diaphragm 2 of the pressure sensor chip 1, and white dots show the absolute value of the main stress which acts on the pedestal 5. As shown in the drawings, when T/T1 is decreased from 7.5 to 1.25, the stress can be reduced from 100% to 50%. As described above, the stress generated in the pressure sensor chip 1 can be reduced by making the ratio of the thickness of the pedestal 5 and the thickness of the pressure sensor chip 1 7.5 or less. Furthermore, since the thickness of the pedestal 5 is reduced, an ordinary temperature heater for use in IC molding can be employed for raising the temperature to a level which is necessary for wire bonding.

Figure 7:
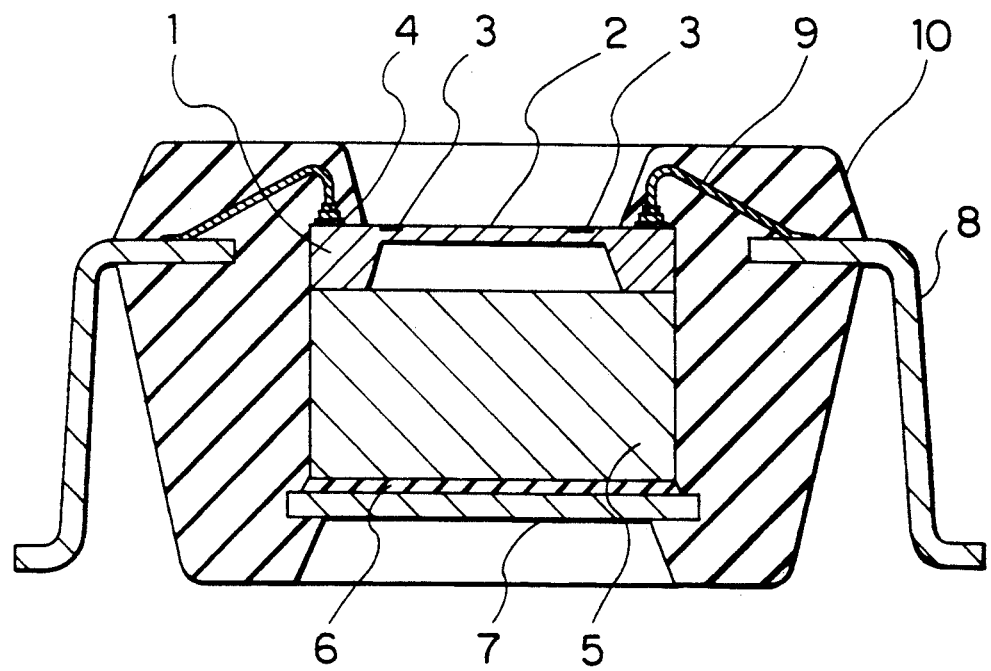
FIG. 7 is a cross sectional view which illustrates another embodiment of the pressure sensor according to the present invention.
Figure 8:
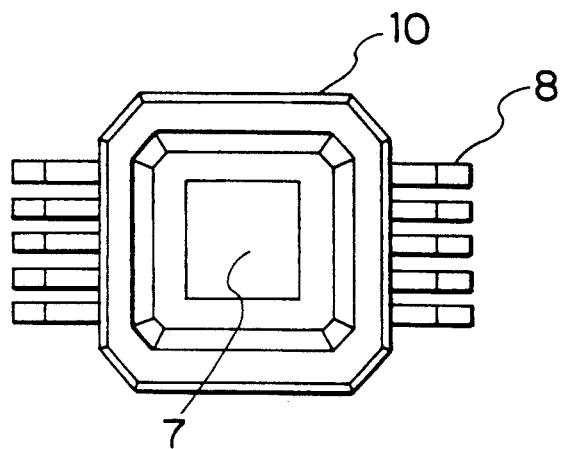
FIG. 8 is a plan view which illustrates another embodiment of the pressure sensor according to the present invention.
Figure 9:
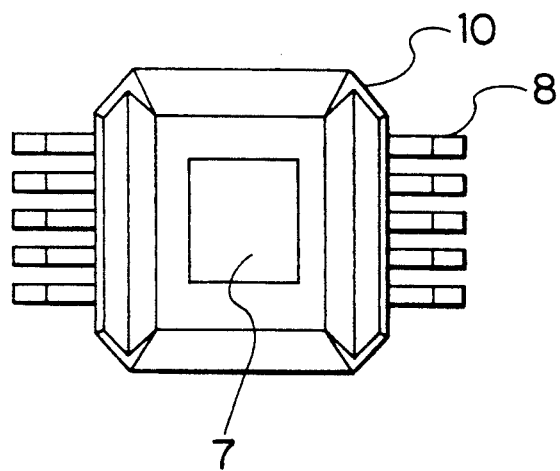
FIG. 9 is a plan view which illustrates another embodiment of the pressure sensor according to the present invention.

Although the outer package 10 is not formed on the reverse side of the die pad 7 in the structure shown in FIG. 5, another structure shown in FIG. 7 may be employed in which the outer package 10 covers the end portion of the reverse side of the die pad 7 so as to make the diameter of the opening larger than the diameter D1. The shape of the reverse side of the pressure sensor may be arranged variously. For example, a symmetrical shape as shown in FIG. 8 and a structure shown in FIG. 9 in which the confronting surfaces are symmetrical with each other can be employed.

Figure 10:
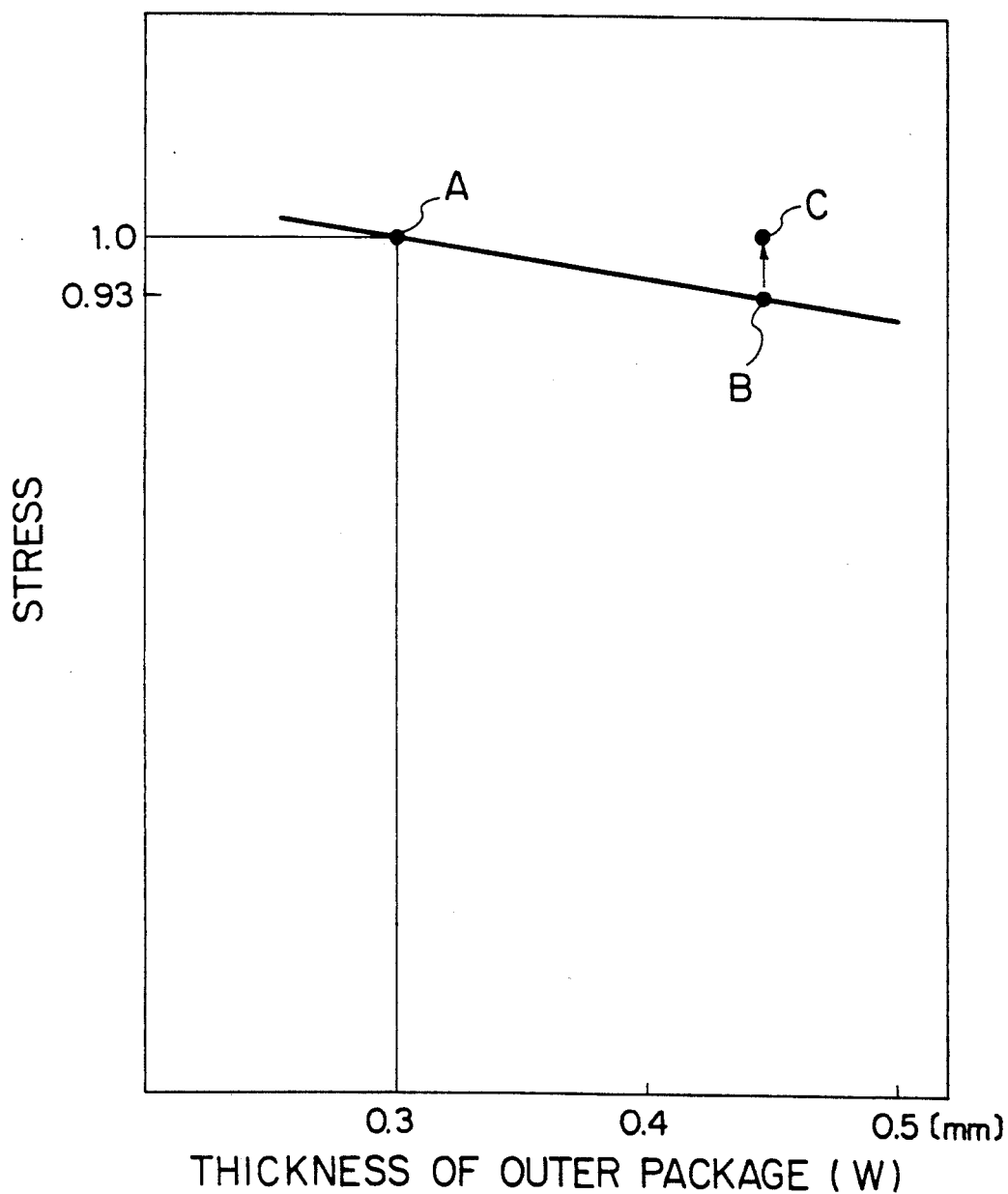
FIG. 10 is a graph which illustrates the relationship between the thickness of the outer package and the stress of the diaphragm.
Figure 11:
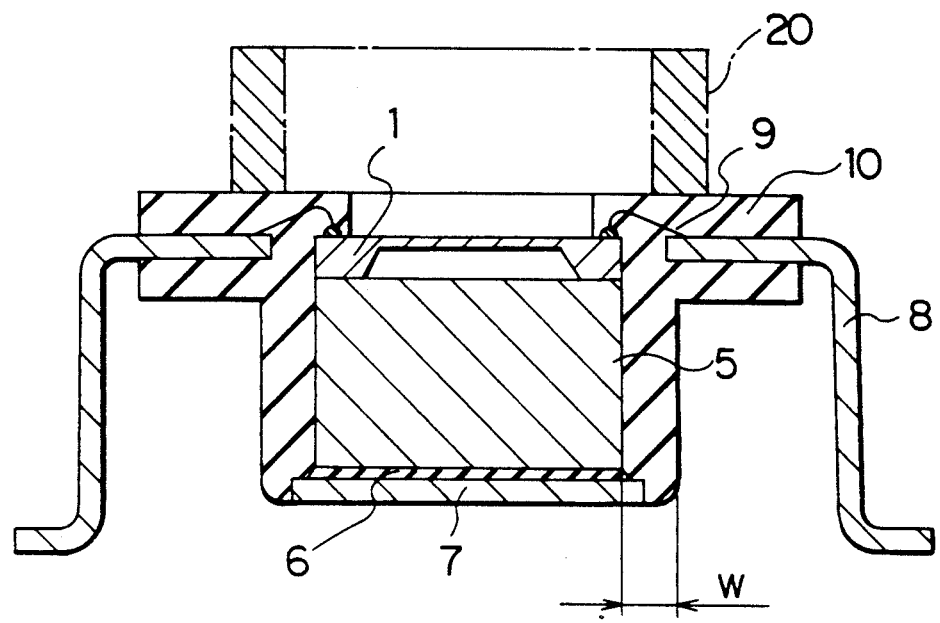
FIG. 11 is a cross sectional view of the pressure sensor which illustrates the thickness of the outer package shown in FIG. 10.
Figure 12:
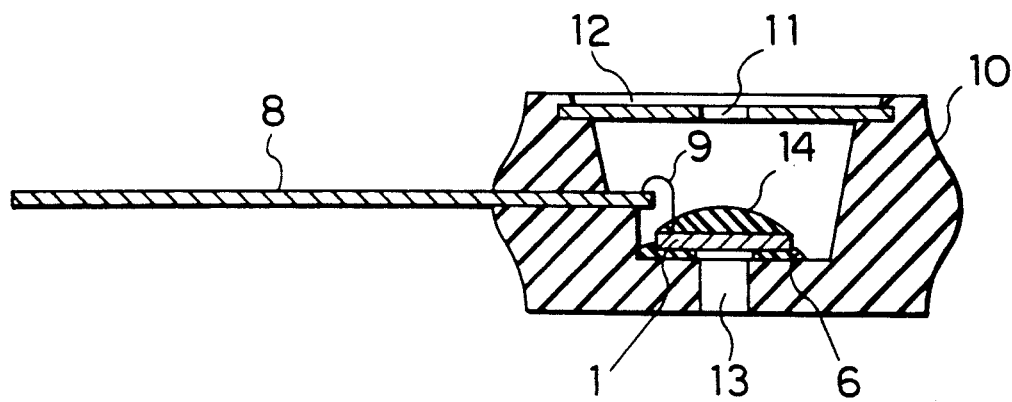
FIG. 12 is a cross sectional view which illustrates a conventional pressure sensor.
Figure 13:
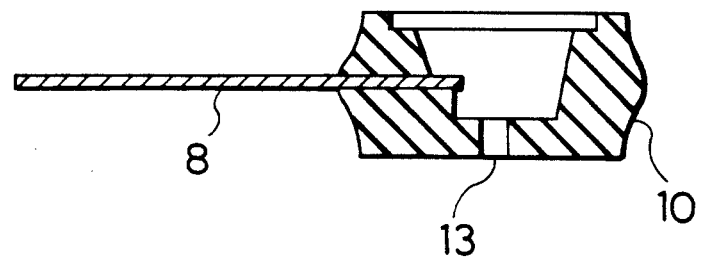
FIG. 13 is a cross sectional view which illustrates the outer package of the pressure sensor shown in FIG. 12.
Figure 14:
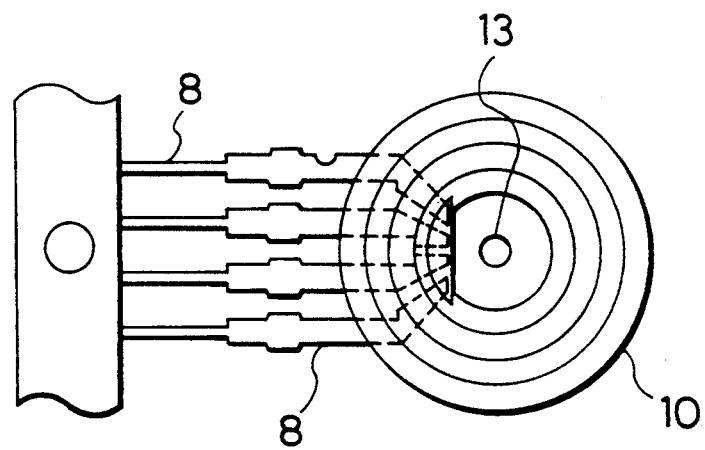
FIG. 14 is a plan view which illustrates the outer package of the pressure sensor shown in FIG. 12.

FIG. 10 illustrates how the stress where the piezoelectric resistor is disposed is changed when thickness W of the outer package 10 shown in FIG. 11 is changed. Since the residual stress where the piezoelectric resistor 3 is disposed can be reduced by enlarging the thickness of the side portion of the outer package 10, the thickness of the resin surrounding the pedestal 5, the die pad 7 and the pressure sensor chip 1 can freely be designed if the thickness is larger than a predetermined value. That is, assuming that the stress when $W = 0.3$ mm (black dot A) is 1 (100%), the stress in the diaphragm portion becomes 93% when $W = 0.45$ mm (black dot B). Furthermore, black dot C shows a fact that the stress becomes 100% since it increases by 7% when a pressure introduction pipe 20 is provided for a pressure sensor arranged in such a manner that $W = 0.45$ mm. As described above, since the integrally molded pressure sensor has an opening formed in the diaphragm portion thereof, the influence of the thickness of the resin layer surrounding the pedestal 5, the die pad 7 and the pressure sensor chip 1 is reduced. Therefore, if the pressure introduction pipe 20 is provided or the shape is deformed to meet a desire, the stress generated in the diaphragm will not be enlarged. In consequence, a pressure sensor having great design freedom can be obtained.

According to the above-described embodiment, the pressure sensor has the pedestal 5. A structure having the pedestal may be employed when the pressure sensor must exhibit an excellent accuracy. Furthermore, a structure having no pedestal may be employed when excellent accuracy is not desired. In this case, a pressure sensor having no pedestal can be manufactured by integral molding in the same assembly process if the mold for the integral molding is changed.

Furthermore, the silicone rubber employed as the die bonding material 6 according to the present invention may be replaced by epoxy resin or solder.

As described above, a pressure sensor exhibiting desired accuracy can be obtained because the thermal stress generated in the pressure sensor chip can freely be reduced. Furthermore, the pressure sensor can be manufactured in a general IC manufacturing process, so that a cheap and high quality pressure sensor can be produced. In addition, the ratio of the thickness of the pedestal and the thickness of the pressure sensor chip can be reduced to 7.5 or less. Therefore, the temperature which is necessary for wire bonding can be lowered and diffusion of the base metal into the plating layer formed on the lead frame is reduced. As a result, the thickness of the plating can be reduced.

What is claimed is:

1. A semiconductor pressure sensor comprising:

a semiconductor pressure sensor chip including a resistor and a diaphragm for sensing a pressure of a medium;

a pedestal on which said semiconductor pressure sensor chip is disposed;

a die pad on which said pedestal is mounted;

leads;

wires electrically connecting said leads to said semiconductor pressure sensor chip; and a resin package integrally encapsulating and contacting said pedestal, said leads, said wires, part of said die pad, and part of said semiconductor pressure sensor chip, said resin package including an opening exposing said diaphragm for directly contacting a medium, the pressure of which is to be sensed.

2. The semiconductor pressure sensor of claim 1 wherein said pedestal has a thickness between said die pad and said pressure sensor chip of T and said diaphragm has a thickness of T1 and the ratio of T to T1 is no more 7.5.

3. The semiconductor pressure sensor of claim 1 wherein the opening in said resin package exposing said diaphragm and said diaphragm are circular and the ratio of the diameter of said opening to the diameter of said diaphragm is at least 1.

4. The semiconductor pressure sensor of claim 1 wherein said resin is an epoxy resin.

5. The semiconductor pressure sensor of claim 1 wherein said pedestal is mounted on said die pad with silicone rubber.

* * * * *

UNITED STATES PATENT AND TRADEMARK OFFICE
CERTIFICATE OF CORRECTION

PATENT NO. : 5,207,102

DATED : May 4, 1993

INVENTOR(S) : Takahashi et al.

It is certified that error appears in the above-identified patent and that said Letters Patent is hereby corrected as shown below:

Claim 2, col. 6, line 20, after "more" insert --than--.

Signed and Sealed this

Fourth Day of January, 1994

Attest:

BRUCE LEHMAN

*Attesting Officer*     *Commissioner of Patents and Trademarks*